United States Patent [19]

Ishihara et al.

[11] Patent Number: 4,759,947
[45] Date of Patent: Jul. 26, 1988

[54] METHOD FOR FORMING DEPOSITION FILM USING SI COMPOUND AND ACTIVE SPECIES FROM CARBON AND HALOGEN COMPOUND

[75] Inventors: Shunichi Ishihara, Ebina; Masaaki Hirooka, Nabari; Shigeru Ohno, Yokohama, all of Japan

[73] Assignee: Canon Kabushiki Kaisha, Tokyo, Japan

[21] Appl. No.: 784,761

[22] Filed: Oct. 7, 1985

[30] Foreign Application Priority Data

Oct. 8, 1984 [JP] Japan .................. 59-209659
Oct. 9, 1984 [JP] Japan .................. 59-210489
Oct. 10, 1984 [JP] Japan .................. 59-211799

[51] Int. Cl.$^4$ ............................. B05D 3/06
[52] U.S. Cl. ........................ 427/38; 427/39; 427/53.1; 427/255.1; 427/255.2; 427/255.7
[58] Field of Search ............ 427/42, 51, 55, 85, 427/86, 248.1, 255, 255.1, 255.2, 38, 39, 45.1, 53.1, 54.1, 82, 255.7, 162

[56] References Cited

U.S. PATENT DOCUMENTS

| | | | |
|---|---|---|---|
| 3,473,978 | 10/1969 | Jackson et al. | 148/175 |
| 3,825,439 | 7/1974 | Tick | 117/106 R |
| 3,916,034 | 10/1975 | Tsuchimoto | 427/38 |
| 4,077,818 | 3/1978 | Chu | 148/174 |
| 4,084,024 | 4/1978 | Schumacher | 427/215 |
| 4,217,374 | 8/1980 | Ovshinsky et al. | 427/39 |
| 4,220,488 | 9/1980 | Duchemin et al. | 148/175 |
| 4,282,267 | 8/1981 | Kuyel | 427/38 |
| 4,402,762 | 9/1983 | John et al. | 148/1.5 |
| 4,410,559 | 10/1983 | Hamakawa et al. | 427/86 |
| 4,419,381 | 12/1983 | Yamazaki | 427/39 |
| 4,430,185 | 2/1984 | Shimomoto | 204/192 P |
| 4,434,188 | 2/1984 | Kamo et al. | 427/39 |
| 4,439,463 | 3/1984 | Miller | 427/39 |
| 4,448,801 | 5/1984 | Fukuda et al. | 427/39 |
| 4,450,185 | 5/1984 | Shimizu et al. | 427/39 |
| 4,461,783 | 7/1984 | Yamazaki | 427/39 |
| 4,466,992 | 8/1984 | Dreiling | 427/39 |
| 4,468,413 | 8/1984 | Bachmann | 427/39 |
| 4,468,443 | 8/1984 | Shimizu et al. | 430/60 |
| 4,471,042 | 9/1984 | Komatsu et al. | 430/64 |
| 4,485,125 | 11/1984 | Izu et al. | 427/74 |
| 4,504,518 | 3/1985 | Ovshinsky et al. | 427/38 |
| 4,514,437 | 4/1985 | Nath | 427/39 |
| 4,517,223 | 5/1985 | Ovshinsky et al. | 427/39 |
| 4,521,447 | 6/1985 | Ovshinsky et al. | 427/45.1 |
| 4,522,663 | 6/1985 | Ovshinsky et al. | 148/403 |
| 4,526,805 | 7/1985 | Yashizawa | 427/38 |
| 4,532,199 | 7/1985 | Ueno et al. | 427/86 |
| 4,543,267 | 9/1985 | Yamazaki | 427/39 |
| 4,544,423 | 10/1985 | Tsuge et al. | 427/39 |
| 4,546,008 | 10/1985 | Smith et al. | 427/86 |
| 4,554,180 | 11/1985 | Hirooka | 427/255.1 |
| 4,564,533 | 1/1986 | Yamazaki | 427/53.1 |
| 4,564,997 | 1/1986 | Matsuo et al. | 29/576 W |
| 4,567,127 | 1/1986 | Saitoh et al. | 430/65 |
| 4,569,697 | 2/1986 | Tsu et al. | 427/86 |
| 4,582,560 | 4/1986 | Sanjurjo | 156/613 |
| 4,615,905 | 10/1986 | Ovshinsky | 427/39 |
| 4,657,777 | 4/1987 | Hirooka | 427/39 |
| 4,664,937 | 5/1987 | Ovshinsky et al. | 427/39 |
| 4,689,093 | 8/1987 | Ishihara et al. | 437/5 |
| 4,702,934 | 10/1987 | Ishihara et al. | 427/39 |

FOREIGN PATENT DOCUMENTS

| | | |
|---|---|---|
| 74212 | 3/1983 | European Pat. Off. |
| 90586A | 10/1983 | European Pat. Off. |
| 57-66625 | 4/1982 | Japan. |
| 59-199035 | 4/1983 | Japan. |
| 2038086A | 7/1980 | United Kingdom. |
| 2148328A | 5/1985 | United Kingdom. |

OTHER PUBLICATIONS

Brodsyk et al., 22 IBM Technical Disclosure Bulletin 3391 (Jan. 1980).
Janai et al., 52 J. Appl. Phys. 3622 (May 1981).

*Primary Examiner*—Sadie L. Childs
*Attorney, Agent, or Firm*—Fitzpatrick, Cella, Harper & Scinto

[57] ABSTRACT

A method for forming a deposition film comprises introducing, into a film forming chamber for forming a deposition film on a substrate, a silicon compound as a material for film formation and an active species generated from a compound containing carbon and halogen and capable of chemical interaction with said silicon compound, and applying thereto at least an energy selected from optical, thermal and discharge energies to excite said silicon compound and to cause a reaction thereof, thus forming a deposition film on said substrate.

11 Claims, 7 Drawing Sheets

METHOD FOR FORMING DEPOSITION FILM USING SI COMPOUND AND ACTIVE SPECIES FROM CARBON AND HALOGEN COMPOUND

BACKGROUND OF THE INVENTION

1. Field of the Invention

The present invention relates to a method suitable for forming a silicon-containing deposition film, principally a functional film, and more particularly a non-single crystalline deposition film such as amorphous silicon or polycrystalline silicon adapted for use in semiconductor devices, electrophotographic photosensitive devices, linear image sensors, imaging devices, photoelectric devices or the like.

2. Description of the Prior Art

As an example, formation of an amorphous silicon film (hereinafter abbreviated as "a-Si") has been tried with various methods such as vacuum evaporation, plasma CVD, CVD, reactive sputtering, ion plating and light CVD, and is generally formed by the plasma CVD method in industrial application.

However a deposition film composed of amorphous silicon still has many points to be improved, in terms of electrical and optical properties, fatigue characteristic in repeated use, behavior in the atmospheric conditions at use, and productivity or mass-productivity including uniformity and reproducibility.

The reaction involved in the formation of an amorphous silicon deposition film through the conventionally popular plasma CVD method is considerably more complicated than that in the conventional CVD method, and the mechanism thereof has not been fully clarified. Also such deposition film has many parameters such as temperature of substrate, flow rate and ratio of introduced gasses, pressure at film formation, high-frequency electric power, structure of electrode, structure of reactor, rate of gas discharge, plasma generating method etc., which in combination often result in unstable plasma generation, eventually giving rise to a significant undesirable influence to the deposited film. Also the manufacturing parameters have to be determined for each apparatus, so that it has been difficult to generalize such manufacturing conditions. However the use of the plasma CVD method is presently accepted as best for obtaining an amorphous silicon film with satisfactory electrical, optical, photoconductive or mechanical properties required in various applications.

In certain applications requiring high-speed reproducible mass production while sufficiently achieving a larger film with uniform thickness and quality, there is required a significant capital investment in the mass production equipment for the formation of amorphous silicon deposition film through the plasma CVD method, with complex control parameters of narrow control tolerances, and the equipment itself requires delicate control. On the other hand, the conventional technology with the ordinary CVD method requires a high temperature and is unable to provide a practically acceptable deposition film.

As explained in the foregoing, there has been long desired a method capable of mass producing the amorphous silicon film with inexpensive equipment, while maintaining the uniformity and other properties required in the application. Same requirement exists also for other functional films, such as of silicon nitride, silicon carbide, or silicon oxide The present invention, therefore, is to provide a novel method of film deposition, which is free from the above-mentioned drawbacks of the plasma CVD method and is not dependent on the conventional technologies.

SUMMARY OF THE INVENTION

An object of the present invention is to provide a method for forming a deposition film adapted for producing a larger film, thus easily achieving higher productivity and mass production, while improving the characteristic, film forming speed and reproducibility and maintaining the uniformity in the produced film.

According to the present invention, there is provided a method for forming a deposition film, by introducing a silicon compound constituting a material for film formation and an active species formed from a compound containing carbon and halogen atoms and capable of chemical interaction with said silicon compound into a film forming chamber for forming a deposition film on a substrate, and applying at least one energy selected from optical, thermal and electrical discharge energies thereto, thereby exciting said silicon compound and causing a reaction thereof, thus forming a deposition film on said substrate.

DETAILED DESCRIPTION OF THE PREFERRED EMBODIMENTS

Figure 1:
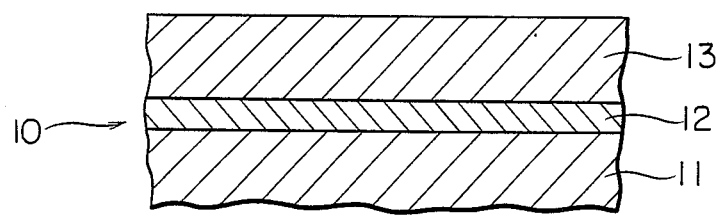
FIG. 1 is a schematic view showing an example of an electrophotographic imaging member produced with the method of the present invention.

In the method of the present invention, a previously activated species is introduced into the film forming chamber as one of the materials for film formation, so that film formation is rendered possible with an optical, thermal or discharge energy applied in said chamber. Consequently the deposition film thus formed is substantially free from etching or other undesirable effects for example of abnormal discharge.

Also the method of the present invention allows operation of the CVD process in a more stable manner by arbitrarily controlling the temperatures of the substrate and atmosphere in said chamber.

In the method of the present invention, the exciting energy may be supplied either uniformly or selectively to the materials reaching the vicinity of the substrate. In case of using optical energy, it may either be directed to the entire surface of the substrate through an appropriate optical system to form a deposition film on said surface, or directed only to a desired part to form the deposition film in a partial area. It is also possible to form a deposition film by irradiation of a determined pattern, defined for example with a photoresist.

In case of using thermal energy, it is applied at least to the vicinity of the substrate in the film forming chamber, or to the entire chamber. Any known heating method, for example heating with a heat generating element such as an electrical resistor or high-frequency heating, may be employed for this purpose. It is also possible to utilize thermal energy converted from optical enerzy, or, if desired, to utilize optical en energy in combination with thermal energy.

Furthermore, in the method of the present invention, energy of electrical discharge may also be employed as the exciting energy, optionally in combination with optical and/or thermal energy.

One of the differences between the method of the present invention and the conventional CVD process lies in a fact that the use of an active species which is activated in advance in an activating space or chamber separate from the film forming chamber, and this fact enables drastic improvements in the film forming speed in comparison with the conventional CVD process and to use a lower substrate temperature at the film formation, thus realizing large-scale low-cost production of a deposition film of stable quality.

The aforementioned active species employed in the present invention is a substance capable of a chemical interaction with the aforementioned compound for film formation or an excited deposition compound thereof, thus providing an energy thereto or causing a chemical reaction therewith to accelerate the formation of the deposition film. Consequently said active species may or may not contain a component whch will become a constituent of the layer to be formed.

According to the present invention, in consideration of the productivity and ease of handling, the active species to be introduced from the activating chamber to the film forming chamber has a lifetime preferably of 0.1 second or longer, more preferably of 5 seconds or longer, and most preferably of 15 seconds or longer.

The silicon compound employed in the present invention as a material for forming the deposition film is preferably in the gaseous state prior to the introduction into the film forming chamber, or is gasified at said introduction. For example a liquidous compound may be introduced into the film forming chamber after gasification with a suitable gasifier connected to the source of said compound. Examples of said silicon compounds employable in the present invention are silanes and siloxanes in which hydrogen, oxygen, halogens and/or hydrocarbon groups are combined to silicon, and particularly preferred are linear and cyclic silanes, and substituted silanes in which all or a part of hydrogen atoms in such linear or cyclic silane is substituted by halogen atoms.

Specific examples of such compounds are linear silanes represented by a general formula $Si_pH_{2p+2}$ wherein p is an integer at least equal to 1, preferably in a range from 1 to 15, more preferably in a range from 1 to 10, such as $SiH_4$, $Si_2H_6$, $Si_3H_8$, $Si_4H_{10}$, $Si_5H_{12}$ or $Si_6H_{14}$; branched linear silanes represented by a general formula $Si_pH_{2p+2}$ wherein p has the same meaning as above, such as $SiH_3SiH(SiH_3)SiH_3$, $SiH_3SiH(SiH_3)Si_3H_7$ or $Si_2H_5SiH(SiH_3)Si_2H_5$; substituted compounds obtained by substituting all or a part of hydrogen atoms of said linear or branched linear silanes with halogen atoms; cyclic silanes represented by a general formula $Si_qH_{2q}$ wherein q is an integer at least equal to 3, preferably in a range from 3 to 6, such as $Si_3H_6$, $Si_4H_8$, $Si_5H_{10}$ or $Si_6H_{12}$; substituted compounds obtained by substituting all or a part of the hydrogen atoms of said cyclic silanes with other cyclic silanyl and/or linear silanyl groups; and halogen-substituted linear or cyclic silanes represented by a general formula $Si_rH_sX_t$ wherein X stands for a halogen atom, r is an integer at least equal to 1, preferably in a range from 1 to 10, more preferably in a range from 3 to 7, and s+t is equal to 2r+2 or 2r, obtained by substituting all or a part of the hydrogen atoms of the above-mentioned silanes with halogen atoms, such as $SiH_3F$, $SiH_3Cl$, $SiH_3Br$ or $SiH_3I$. These compounds may be employed singly or as a mixture thereof.

In the present invention, the carbon and halogen containing compound to be introduced into the activating chamber is a compound obtained for example by substituting all or a part of hydrogen atoms of a linear or cyclic hydrocarbon with halogen atoms, and specific examples of such compounds are linear carbon halides represented by a general formula $C_uY_{2u+2}$ wherein u is an integer at least equal to 1 and Y is F, Cl, Br or I; cyclic carbon halides represented by a general formula $C_vY_{2v}$ wherein v is an integer at least equal to 3 and Y has the same meaning as above; and linear or cyclic compounds represented by a general formula $C_uH_xY_y$ wherein u and y have the same meaning as above, and x+y is equal to 2u or 2u+2.

Specific examples of the above-mentioned comounds are gaseous or easily gasifiable ones such as $CF_4$, $(CF_2)_5$, $(CF_2)_6$, $(CF_2)_4$, $C_2F_6$, $C_3F_8$, $CHF_3$, $CH_2F_2$, $CCl_4$, $(CCl_2)_5$, $CBr_4$, $(CBr_2)_5$, $C_2Cl_6$ and $C_2Cl_3F_3$.

In the present invention, in addition to the active species obtained by activating the aforementioned compound containing carbon and halogen, it is possible to use, in combination, an active species generated by activating a compound containing silicon and halogen. Examples of such compound containing silicon and halogen are those obtained by substituting all or a part of the hydrogen atoms of linear or cyclic silanes with halogen atoms, and more specifically are linear silicon halogenides represented by a general formula $Si_xZ_{2v+2}$ wherein v is an integer at least equal to 1 and Z is F, Cl, Br or I; cyclic silicon halogenides represented by a general formula $Si_vZ_{2v}$ wherein v is an integer at least equal to 3 and Z has the same meaning as above; and linear or cyclic compounds represented by a general formula $Si_vH_xZ_y$ wherein V and Y have the same meaning as above, and x+y is equal to 2v or 2v+2.

Specific examples of the above-mentioned compounds are gaseous or easily gasifiable ones such as $SiF_4$, $(SiF_2)_5$, $(SiF_2)_6$, $(SiF_2)_4$, $Si_2F_6$, $Si_3F_8$, $SiHF_3$, $SiH_2F_2$, $SiCl_4$, $(SiCl_2)_5$, $SiBr_4$, $(SiBr_2)_5$, $Si_2Cl_6$ and $Si_2Cl_3F_3$.

For generating the active species, there may be employed silicon, other silicon compounds, hydrogen and halogen compounds such as $F_2$ gas, $Cl_2$ gas, gasified $Br_2$, $I_2$ etc., in addition to the aforementioned compound containing carbon and halogen, optionally with the compound containing silicon and halogen.

In the present invention, the formation of active species in the activating chamber is achieved by an exciting energy such as discharge, thermal or optical energy in consideration of the apparatus and equipment in the respective case.

The active species is generated by applying an exciting energy such as heat, light or electrical discharge to the above-mentioned substance in the activating chamber.

In the present invention, the ratio, in the film forming chamber, of the silicon compound employed as the film forming material and the active species from the activating chamber is suitably determined in consideration of the film forming conditions and of the active species employed, but is preferably in a range from 10:1 to 1:10 in the ratio of introduced flow rates, and more preferably in a range from 8:2 to 4:6.

In the present invention, in addition to the above-mentioned silicon compound, there may be introduced, into the film forming chamber, other layer forming materials such as hydrogen gas, halogen compound such as $F_2$ gas, $Cl_2$ gas, gasified $Br_2$ or $I_2$, and inert gas such as argon or neon. In case of using plurality of such gases, they may either be mixed prior to the introduction to the film forming chamber or be supplied separate to the film forming chamber from respective sources.

It is also possible to dope the deposition layer, prepared according to the method of the present invention, with an impurity element. Preferred examples of p-type impurity are the elements of group IIIA of the periodic table, such as B, Al, Ga, In and Tl, and those of n-type impurity are the elements of group VA of the periodic table, such as N, P, As, Sb and Bi, in which particularly preferred ones are B, Ga, P and Sb. The amount of doping is suitably determined in consideration of the electrical and optical characteristics required.

Preferably there is to be employed a compound containing such impurity element as a component thereof, which is gaseous under normal temperature and pressure, or is gaseous at least under the film depositing conditions and easily gasifiable with a suitable gasifier. Examples of such compounds are $PH_3$, $P_2H_4$, $PF_3$, $PF_5$, $PCl_3$, $AsH_3$, $AsF_3$, $AsF_5$, $AsCl_3$, $SbH_3$, $SbF_5$, $BH_3$, $BF_3$, $BCl_3$, $BBr_3$, $B_2H_6$, $B_4H_{10}$, $B_5H_9$, $B_5H_{11}$, $B_6H_{10}$, $B_6H_{12}$ and $AlCl_3$. Such impurity containing compounds may be employed singly or as a mixture of two or more.

Such impurity containing compound may be introduced into the film forming chamber, either in a mixed state with the aforementioned silicon compound etc. prior to said introduction, or separately from respective gas sources.

In the following the present invention will be further clarified by examples of an electrophotographic imaging member prepared by the method of the present invention.

FIG. 1 schematically shows the structure of a typical photoconductive member obtained by the method of the present invention.

A photoconductive member 10, shown in FIG. 1, can be employed as an electrophotographic imaging member, and comprises a substrate 11, an intermediate layer 12 as optionally formed, and a photosensitive layer 13.

The substrate 11 can be either electrically conductive or insulating. A conductive substrate can be composed, for example, of a metal such as NiCr, stainless steel, Al, Cr, Mo, Au, Ir, Nb, Ta, V, Ti, Pt, Pd or an alloy thereof.

An insulating substrate can be composed of a film or a sheet of a synthetic resin such as polyester, polyethylene, polycarbonate, cellulose acetate. polypropylene, polyvinyl chloride, polyvinylidene chloride, polystyrene or polyamide, glass, ceramic material or paper. Such insulating substrate is preferably subjected, at least on a surface thereof, to a treatment for obtaining conductivity, and other layers are preferably provided on said surface which is thus rendered conductive.

As an example, in case of a glass substrate, electrical conductivity is realized by forming a thin layer of NiCr, Al, Cr, Mo, Au, Ir, Nb, Ta, V, Ti, Pt, Pd, $In_2O_3$, $SnO_2$, or ITO ($In_2O_3 + SnO_2$) on a surface of said substrate. On the other hand, in case of a plastic film such as polyester film, the conductive treatment is effected by depositing a metal such as NiCr, Al, Ag, Pb, Zn, Ni, Au, Cr, Mo, Ir, Nb, Ta, V, Ti or Pt by vacuum evaporation, electro beam evaporation or sputtering, or laminating the above-mentioned metal. The substrate may be arbitrarily shaped, for example a cylinder, a belt or a plate according to the intended use. For example, the photoconductive member 10 shown in FIG. 1 is desirably formed as an endless belt or a cylinder in case of use as an electrophotographic imaging member for high-speed continuous copying.

The intermediate layer 12 is for example provided with a function of effectively blocking the flow of carriers from the substrate 11 to the photosensitive layer 13 and allowing the movement of photocarriers, generated in the photosensitive layer 13 by irradiation of an electromagnetic wave, from said photosensitive layer 13 toward the substrate 11.

Said intermediate layer 12 is composed of amorphous silicon containing hydrogen atoms (H) and/or halogen atoms (X) (hereinafter expressed as a-Si(H, X)) and contains a p-type impurity such as B or an n-type impurity such as P for controlling the electrical conductivity.

In the present invention, the amount of such conductivity-controlling material such as B or P present in the intermediate layer 12 is preferably in a range of $0.001-5 \times 10^4$ atomic ppm, more preferably in a range of $0.5-1 \times 10^4$ atomic ppm, and most preferably in a range of $1-5 \times 10^3$ atomic ppm.

In case the intermediate layer 12 is formed, the formation of the photosensitive layer 13 can be effected in continuous manner. In such case the active species generated in the activating chamber and silicon compound in gaseous state, optionally together with hydrogen, halogen compound, inert gas, impurity-containing gaseous compound etc. are introduced into the film forming chamber containing the substrate 11, and at least an exciting energy selected from optical, thermal and discharge energies is applied to form the intermediate layer 12 on said substrate 11.

The compound containing carbon and halogen, introduced into the activating chamber at the formation of the intermediate layer 12, easily generate an active species such as $CF_2^*$ at a high temperature.

The thickness of the intermediate layer 12 is preferably in a range from 30 Å to 10 $\mu$, more preferably from 40 Å to 8 $\mu$, and most preferably from 50 Å to 5 $\mu$.

The photosensitive layer 13 is composed for example of a-Si(H, X), and has functions of generating photocarriers in response to the irradiation of a laser beam and of transporting said photocarriers.

The thickness of the photosensitive layer 13 is preferably in a range from 1 to 100 $\mu$, more preferably from 1 to 80 $\mu$, and most preferably from 2 to 50 $\mu$.

The photosensitive layer 13 is composed of undoped a-Si(H, X), but, if desirable, it may contain a material for achieving a conductive polarity opposite to that of the polarity-determining material in the intermediate layer 12, or a material for achieving a conductive polarity same as that of but in a smaller amount than the polarity-determining material in the intermediate layer 12.

The formation of the photosensitive layer 13 is achieved, as in the case of the intermediate layer 12, by introducing the compound containing carbon and halogen into the activating chamber, and introducing the active species, generated by decomposition of said compound at a high temperature, into the film forming chamber. Separately the silicon compound in gaseous state, optionally together with hydrogen, halogen compound, inert gas, impurity-containing gaseous compound etc. is introduced into the film forming chamber containing the substrate 11, and at least an exciting energy, selected from optical, thermal and discharge energies, is applied to form the photosensitive layer 13 on said substrate 11.

Figure 2:
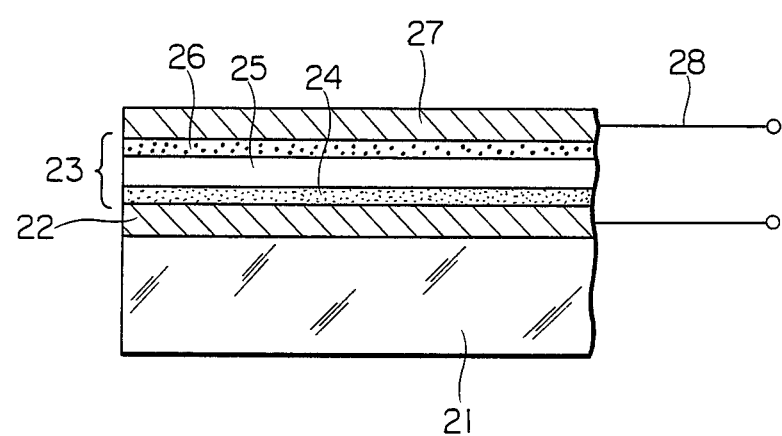
FIG. 2 is a schematic view showing an example of a PIN diode produced by the method of the present invention.

FIG. 2 schematically shows a PIN diode device utilizing an impurity-doped a-Si deposition film obtained by the method of the present invention.

In FIG. 2, there are shown a substrate 21, thin film electrodes 22, 27, a semiconductor layer 23 consisting of an n-type a-Si layer 24, an i-type a-Si layer 25 and a p-type a-Si layer 26, and conductors 28.

The substrate 21 is semiconductive or, preferably, insulating. Examples of semiconductive substrate are Si and Ge. The thin film electrodes 22, 27 are obtained by depositing thin films for example of NiCr, Al, Cr, Mo, Au, Ir, Nb, Ta, V, Ti, Pt, Pd $In_2O_3$, $SnO_2$, ITO $In_2O_3+SnO_2$ etc. by vacuum evaporation, electron beam evaporation or sputtering onto the substrate. The thickness of said electrodes 32, 27 is preferably in a range of $30-5\times 10^4$ Å, more preferably in a range of $100-5\times 10^3$ Å.

The layer constituting the a-Si semiconductor layer 23 can be rendered n-type layer 24 or p-type layer 26 by controlled doping with an n-type impurity and/or a p-type impurity.

In the present invention, the formation of an a-Si layer of n-, i- or p-type is achieved by introducing the compound containing carbon and halogen into the activating chamber, and introducing an active species such as $CF_2^*$, generated by decomposition of said compound at a high temperature, into the film forming chamber. Separately the silicon containing compound in gaseous state, optionally together with an inert gas, an impurity-containing gaseous compound etc., is introduced into the layer forming chamber containing the substrate 11, and at least an exciting energy selected from optical, thermal and discharge energies is applied. The thickness of n- or p-type a-Si layer is preferably in a range from 100 to $10^4$ Å, more preferably from 300 to 2000 Å. The thickness of i-type a-Si layer is preferably in a range from 500 to $10^4$ Å, more preferably from 1000 to 10000 Å.

In the following the present invention will be further described by specific examples thereof.

EXAMPLE 1

Figure 3:
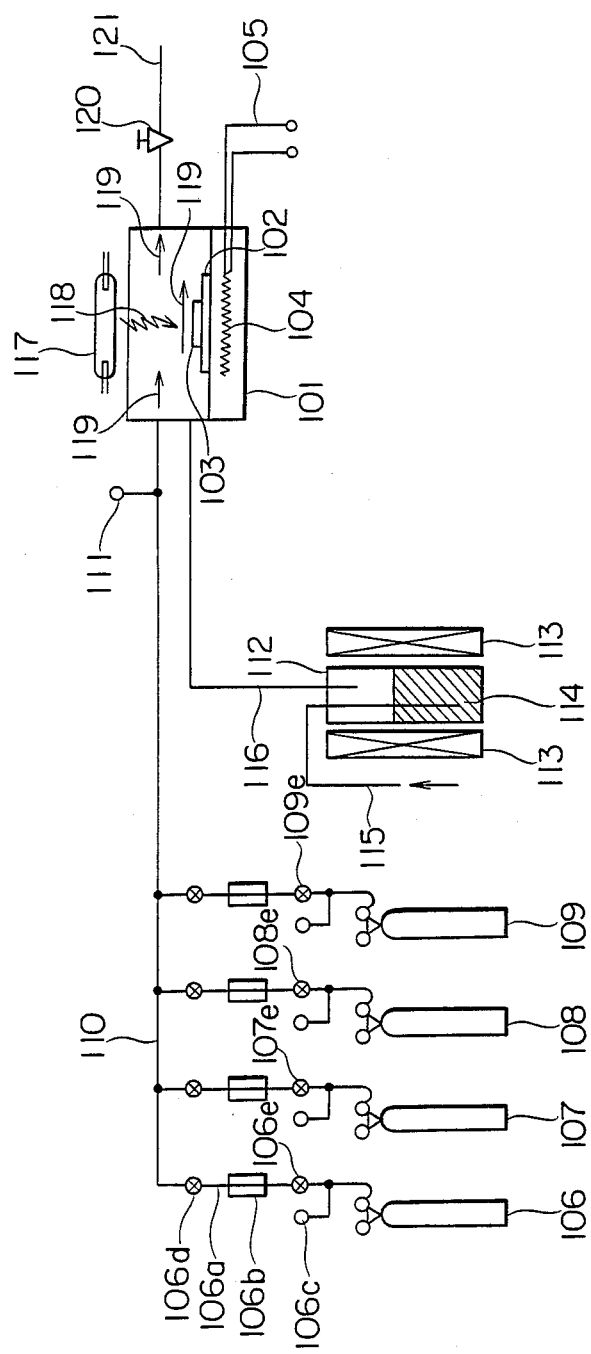
FIGS. 3 to 8 are schematic views showing the structure of apparatus for excecuting the methods of the present invention employed in the embodiments thereof.

An apparatus shown in FIG. 3 was employed in the preparation of a-Si deposition films of i-, p- and n-type through the following operations.

Referring to FIG. 3, a film forming chamber 101 is provided therein with a substrate support 102 on which a desired substrate 103 is placed.

A heater 104 for heating the substrate 103 is powered through lead wires 105 but is not activated during the film formation. The temperature of the substrate is not critical, but, in the execution of the method of the present invention, the substrate is preferably pre-heated to a temperature in a range of 50°–150° C., more preferably 100°–150° C.

Gas sources 106–109 are provided for the silicon compound, and for other gases optionally employed such as hydrogen, halogen compound, inert gas, impurity-containing compound etc. A suitable gasifier is provided for any liquidous material to be employed. In said gas sources 106–109, suffixes a indicate branch tubes, b flow meters, c pressure gauges for measuring the pressure at the high-pressure side of the flow meters, d and e valves for adjusting flow rates. There are further provided a gas introducing pipe 110 into the film forming chamber; a gas pressure gauge 111; an activating chamber 112; an electric furnace 113; solid carbon particles 114; an introducing tube 115 for the gaseous compound containing carbon and halogen for generating the active species; and an introducing tube 116 for the active species, generated in the activating chamber 112, into the film forming chamber 101.

An optical energy generator 117 is composed for example of a mercury lamp, a xenon lamp, a carbon dioxide laser, an argon ion laser or an excimer laser.

Light 118 emitted from the optical energy generator 117 and directed to the entire substrate or a desired part thereof through a suitable optical system (not shown) irradiates the raw material gas flowing in a direction 119, thus exciting said gas and causing reaction therein to form an a-Si deposition film on the substrate 103 or a part thereof. In FIG. 3 there are also shown an exhaust valve 120 and an exhaust tube 121.

At first a substrate 103 composed of a polyethylene terephthalate was placed on the support 102, and the layer forming chamber 101 was evacuated to $10^{-6}$ Torr with a vacuum system. The substrate was maintained at a temperature shown in Table 1, and 150 sccm of $Si_5H_{10}$ from the gas source 106, optionally mixed with 40 sccm of $PH_3$ or $B_2H_6$, diluted to 1000 ppm with hydrogen gas, was introduced into said chamber.

The activating chamber 102 was filled with solid carbon particles 114, which were melted by heating with the electric furnace 113, and $CF_4$ was blown therein from a bomb container through the tube 115, thus generating an active species $CF_2^*$. It was then introduced through the tube 116 into the layer forming chamber 101.

The pressure in said chamber 101 was maintained at 0.1 Torr, and the substrate was vertically irradiated with a xenon lamp of 1 kw to form an undoped or doped a-Si film of a thickness of 700 Å, with a film forming speed of 15 Å/sec.

The undoped or p-type a-Si film thus formed was then placed in an evaporation tank to forming comb-shaped aluminum electrodes (length 250 μ, width 5 mm) at a pressure of $10^{-5}$ Torr. The obtained sample of a-Si film was evaluated by the dark conductivity $\sigma_d$ calculated from the dark current at an applied voltage of 10 V. The results are shown in Table 1.

EXAMPLES 2–4

The process of the Example 1 was reproduced except that $Si_5H_{10}$ was replaced by linear $Si_4H_{10}$, branched $Si_4H_{10}$ or $H_6Si_6F_6$. The obtained values of dark conductivity are summarized in Table 1.

The results in Table 1 indicate that the method of the present invention allows the obtainment of an a-Si film with a satisfactorily high value of $\sigma$ even at a low substrate temperature, and to achieve a sufficient doping therein.

EXAMPLE 5

Figure 4:
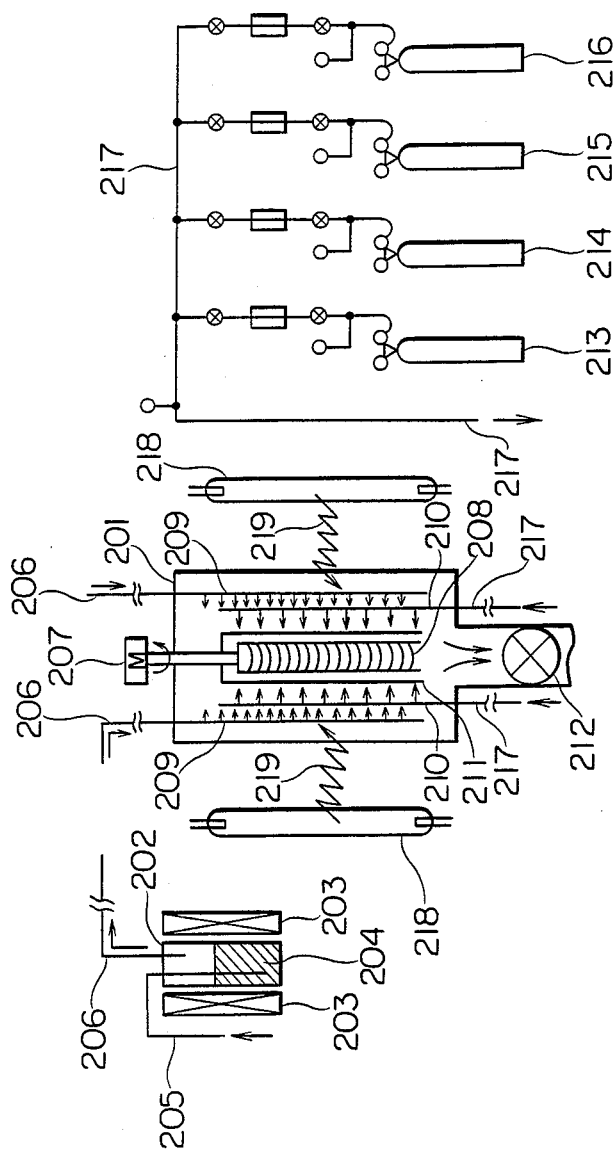

An apparatus shown in FIG. 4 was employed for preparing a drum-shaped electrophotographic imaging member of a structure as shown in FIG. 1, through the following operations.

Referring to FIG. 4, there are provided a film forming chamber 201, an activating chamber 202, an electric furnace 203, solid carbon particles 204, a tube for introducing active species forming substance 205, an active species introducing tube 206, a motor 207, a heater 208, blowing tubes 209 and 210, an aluminum cylinder 211, an exhaust valve 212, gas sources 213–216 similar to those 106–109 shown in FIG. 1, and a gas introducing tube 217.

The aluminum cylinder 211 suspended in the film forming chamber 201 was rendered rotatable by the motor 207 and was internally heated by the heater 208. Optical energy generators 218 illuminated a desired part of the cylinder 211 with light 219.

The activating chamber 202 was charged with solid carbon particles 204, which were melted by heating with the electric furnace 203, and $CF_4$ gas was blown therein from a bomb container to generate an active species $CF_2^*$ for supply into the film forming chamber 201 through the tube 206.

Separately $Si_2H_6$ and $H_2$ were introduced through the tube 217 into the chamber 201, maintained at a pressure of 1.0 Torr, and the periphery of the cylinder 211 was vertically illuminated by xenon lamps of 1 kw.

During the process, the cylinder 211 was rotated, and the used gas was discharged through the exhaust valve 212. A photosensitive layer 13 was formed in this manner.

An intermediate layer of a thickness of 2000 Å was also formed by introducing a gaseous mixture of $H_2$ and $B_2H_6$, containing $B_2H_6$ in 0.2 vol. %, through the tube 217.

REFERENCE EXAMPLE 1

An amorphous silicon deposition film was formed in an ordinary plasma CVD process, utilizing $CF_4$, $Si_2H_6$, $H_2$ and $B_2H_6$ in the film forming chamber shown in FIG. 4 equipped with a high frequency generator of 13.56 MHz.

Table 2 summarizes the manufacturing conditions and performances of the drum-shaped electrophotographic imaging members obtained in Example 5 and Reference Example 1.

EXAMPLE 6

A PIN diode as shown in FIG. 2 was prepared in the apparatus shown in FIG. 3, utilizing $Si_3H_6$ as the silicon compound.

A polyethylene naphthalate substrate 21 having an evaporated ITO film 22 of a thickness of 1000 Å was placed on the support, and the chamber was evacuated to $10^{-6}$ Torr. Then an active species $CF_2^*$ was introduced from the tube 116 as in Example 1, 150 sccm of $Si_3H_6$ and $PH_3$ diluted to 1000 ppm with hydrogen gas from the tube 110, and 20 sccm of a halogen gas from another tube, and light irradiation with a xenon lamp of 1 kw at a pressure of 0.1 Torr in the chamber was conducted to obtain a phosphorus-doped n-type a-Si layer 24 of a thickness of 700 Å.

Subsequently the foregoing step was repeated without the introduction of $PH_3$ gas to obtain an i-type a-Si layer 25 of a thickness of 5000 Å.

Then the foregoing step was repeated except that 40 sccm of diborane gas $B_2H_6$, diluted to 1000 ppm with hydrogen gas, was introduced, to obtain a boron-doped p-type a-Si layer 26 of a thickness of 700 Å. Then electrodes 27 of a thickness of 1000 Å were formed by vacuum evaporation on said p-type layer to obtain a PIN diode.

The diode element of an area of 1 cm² thus obtained was subjected to the measurement of I-V characteristic for evaluating the rectifying characteristic and the photovoltaic effect. The obtained results are summarized in Table 3.

When illuminated with light of an intensity AMI (about 100 mW/cm²) through the substrate, the diode showed a conversion efficiency of 8.5% or higher, an open circuit voltage of 0.92 V, and a short circuit current of 10.5 mA/cm².

EXAMPLE 7

PIN diodes were prepared by reproducing the process of the Example 6 except that linear $Si_4H_{10}$, branched $Si_4H_{10}$ or $H_6Si_6F_6$ was employed as the silicon compound instead of $Si_3H_6$.

The obtained rectifying characteristic and photovoltaic effect are summarized in Table 3.

The results in Table 3 indicate that the method of the present invention allows the obtainment of an a-Si deposition film of satisfactory optical and electrical properties at a lower substrate temperature than in the conventional technology.

EXAMPLE 8

Figure 5:
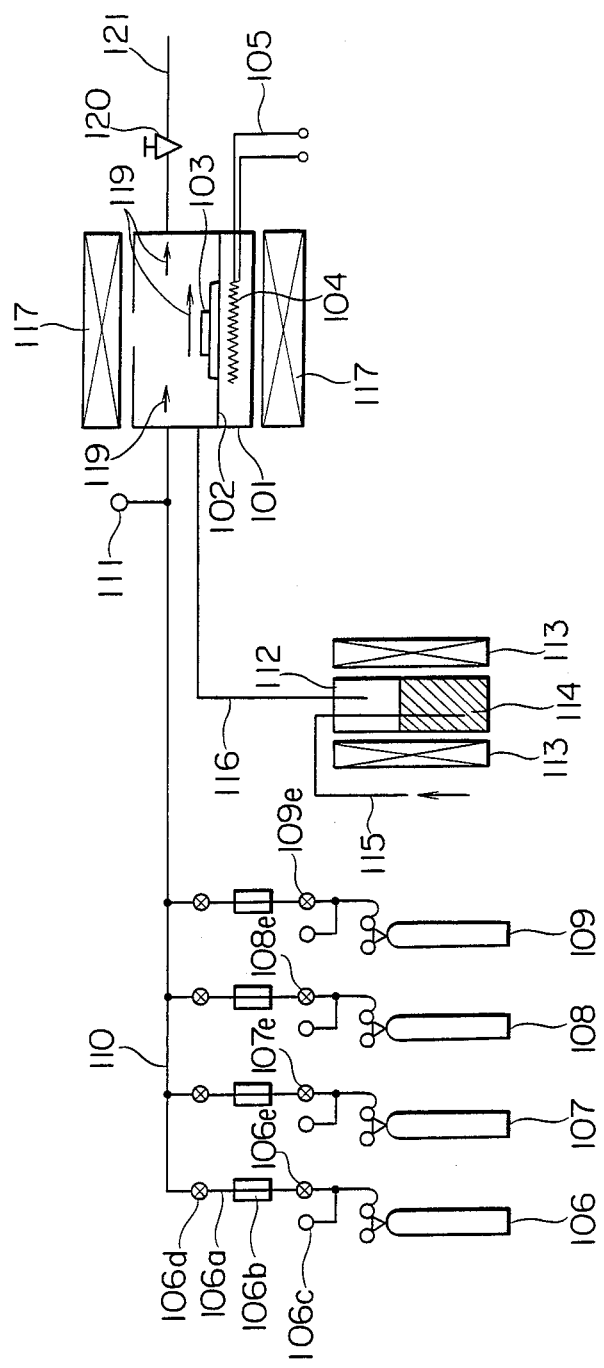

An apparatus shown in FIG. 5 was employed for preparing a-Si deposition films of i-, p- and n-type through the following operations.

Referring to FIG. 5, a film forming chamber 101 is provided therein with a substrate support 102 on which a desired substrate 103 is placed.

A heater 104 for heating the substrate is powered through lead wires 105. The temperature of the substrate is not critical, but, in the execution of the method of the present invention, the substrate is preferably heated to a temperature in a range of 50°–150° C., more preferably 100°–150° C.

Gas sources 106–109 are provided for the silicon compound, and optionally for other gases such as hydrogen, halogen gas, inert gas, impurity-containing compound etc. A suitable gasifier is provided for any liquidous material to be employed. In said gas sources 106–109, suffixes a indicate branch tubes, b flow meters, c pressure gauges for measuring the pressure at the high-pressure side of the flow meters, d and e valves for adjusting flow rates. There are further provided a gas introducing tube 110 into the film forming chamber; a gas pressure gauge 111; an activating chamber 112; an electric furnace 113; solid carbon particles 114; an introducing tube 115 for the gaseous compound containing carbon and halogen for generating the active species; and an introducing tube 116 for the active species, generated in the activating chamber 112, into the film forming chamber 101.

A thermal energy generator 117 can be composed of an ordinary electric furnace, a high frequency heater or other various heating members.

Heat generated by the thermal energy generator 117 is applied to the raw material gases flowing in a direction 119, thus exciting said gases and causing reaction therein to form an a-Si deposition film on the substrate 103 or a part thereof. In FIG. 5 there are also shown an exhaust valve 120 and an exhaust tube 121.

At first a substrate 103 composed of a polyethylene terephthalate film was placed on the support 102, and the film forming chamber 101 was evacuated to $10^{-6}$ Torr with a vacuum system. The substrate was maintained at a temperature shown in Table 1, and 150 sccm of $Si_5H_{10}$ from the gas source 106, optionally mixed with 40 sccm of $PH_3$ or $B_2H_6$, diluted to 1000 ppm with hydrogen gas, was introduced into said chamber.

The activating chamber 102 was charged with solid carbon particles 114, which were fused by heating with the electric furnace 113, and $CF_4$ was blown therein from a bomb container through the tube 115, thus generating an active species $CF_2^*$ for supply into the film forming chamber 101 through the introducing tube 116.

The film forming chamber 101 was maintained at a pressure of 0.1 Torr and at a temperature of 250° C. by said thermal energy generator to obtain an undoped or doped a-Si film of a thickness of 700 Å, with a film forming rate of 16 Å/sec.

The undoped or p-type a-Si film thus formed was then placed in an evaporation tank for forming comb-shaped aluminum electrodes (length 250 μ, width 5 mm) at a pressure of $10^{-5}$ Torr. The obtained sample of a-Si film was evaluated by the dark conductivity $\sigma_d$ calculated from the dark current at an applied voltage of 10 V. The results are shown in Table 4.

EXAMPLES 9–11

The process of Example 8 was reproduced except that $Si_5H_{10}$ was replaced by linear $Si_4H_{10}$, branched $Si_4H_{10}$ or $H_6Si_6F_6$. The obtained values of dark conductivity are summarized in Table 4.

The results in Table 4 indicate that the method of the present invention allows the obtainment of an a-Si film with a satisfactorily high value of $\sigma$ even at a low substrate temperature, and to achieve a sufficient doping therein.

EXAMPLE 12

Figure 6:
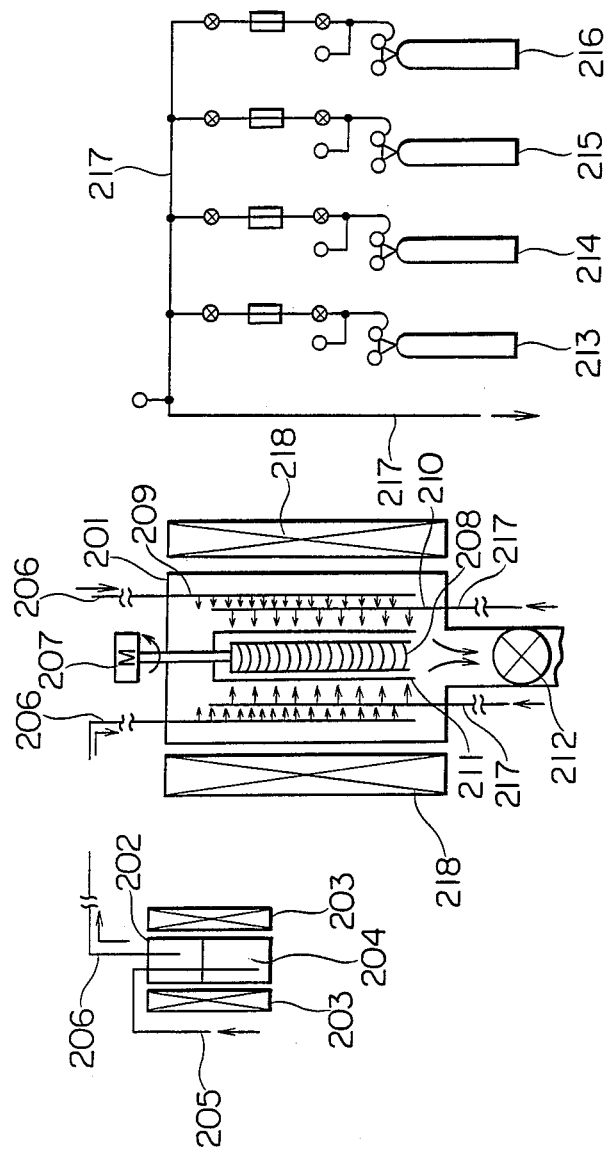

An apparatus shown in FIG. 6 was employed for preparing a drum-shaped electrophotographic imaging member of a structure as shown in FIG. 1, through the following operations.

Referring to FIG. 6, there are provided a film forming chamber 201, an activating chamber 202, an electric furnace 203, solid carbon particles 204, a tube for introducing active species-forming substance 205, an active species introducing tube 206, a motor 207, a heater 208, blowing tubes 209 and 210, an aluminum cylinder 211, an exhaust valve 212, gas sources 213–216 similar to those 106–109 shown in FIG. 1, and a gas introducing tube 217.

The aluminum cylinder 211 suspended in the film forming chamber 201 was rendered rotatable by the motor 207 and was internally heated by the heater 208. A thermal energy generator 218 can be composed for example of an ordinary electric furnace, a high frequency heater or other heating elements.

The activating chamber 202 was charged with solid carbon particles 204, which were melted by heating with the electric furnace 203, and $CF_4$ was blown therein from a bomb container to generate an active species $CF_2^*$ for supply into the film forming chamber 201 through the tube 206.

Separately $Si_2H_6$ and $H_2$ were introduced through the tube 217 into the chamber 201, which was maintained at a pressure of 1.0 Torr, and the interior of said chamber 201 was maintained at 250° C. by the thermal energy generator.

During the process, the aluminum cylinder 211 was heated to 300° C. by the heater and rotated, and the used gas was discharged through the exhaust valve 212. A photosensitive layer 13 was formed in this manner.

An intermediate layer of a thickness of 2000 Å was also formed by introducing a gaseous mixture of $H_2$ and $B_2H_6$, containing $B_2H_6$ in 0.2 vol. %, through the tube 217.

REFERENCE EXAMPLE 2

An amorphous silicon deposition layer was formed in an ordinary plasma CVD process, utilizing $CF_4$, $Si_2H_6$, $H_2$ and $B_2H_6$ in the film forming chamber shown in FIG. 6, additionally equipped with a high frequency generator of 13.56 MHz.

Table 5 summarizes the manufacturing conditions and performances of the drum-shaped electrophotographic imaging members obtained in Example 12 and Reference Example 2.

EXAMPLE 13

A PIN diode as shown in FIG. 2 was prepared in the apparatus shown in FIG. 5, utilizing $Si_3H_6$ as the silicon compound.

A polyethylene naphthalate substrate 21 having an evaporated ITO film 22 of a thickness of 1000 Å was placed on the support, and the chamber was evacuated to $10^{-6}$ Torr. Then an active species $CF_2^*$ was introduced from the tube 116 as in Example 8, 150 sccm of $Si_3H_6$ and $PH_3$ diluted to 1000 ppm with hydrogen gas from the tube 110, and 20 sccm of a halogen gas from another tube, and the chamber was maintained at 0.1 Torr and 250° C. to obtain an n-type phosphorus-doped a-Si layer 24 of a thickness of 700 Å.

Subsequently the foregoing step was repeated without the introduction of $PH_3$ gas to obtain an i-type a-Si layer 25 of a thickness of 5000 Å.

Then the foregoing step was repeated except that 40 sccm of diborane gas $B_2H_6$, diluted to 1000 ppm with hydrogen gas, was introduced, to obtain a boron-doped p-type a-Si layer 26 of a thickness of 700 Å. Then aluminum electrodes 27 of a thickness of 1000 Å were formed by vacuum evaporation on said p-type layer to obtain a PIN diode.

The diode element of an area of 1 cm$^2$ thus obtained was measured for I–V characteristic to evaluate the rectifying characteristic and photovoltaic effect. The obtained results are summarized in Table 6.

When illuminated with light of an intensity AMI (about 100 mW/cm$^2$) through the substrate, the diode showed a conversion efficiency of 8.5% or higher, an open circuit voltage of 0.92 V, and a short circuit current of 10.5 mA/cm$^2$.

EXAMPLE 14

PIN diodes were prepared by reproducing the process of Example 13 except that linear $Si_4H_{10}$, branched $Si_4H_{10}$ or $H_6Si_6F_6$ was employed as the silicon compound instead of $Si_3H_6$. The obtained rectifying characteristic and photovoltaic effect are summerized in Table 6.

The results in Table 6 indicate that the method of the present invention allows the obtainment of an a-Si deposition film of satisfactory optical and electrical properties at a lower substrate temperature than in the conventional technology.

EXAMPLE 15

Figure 7:
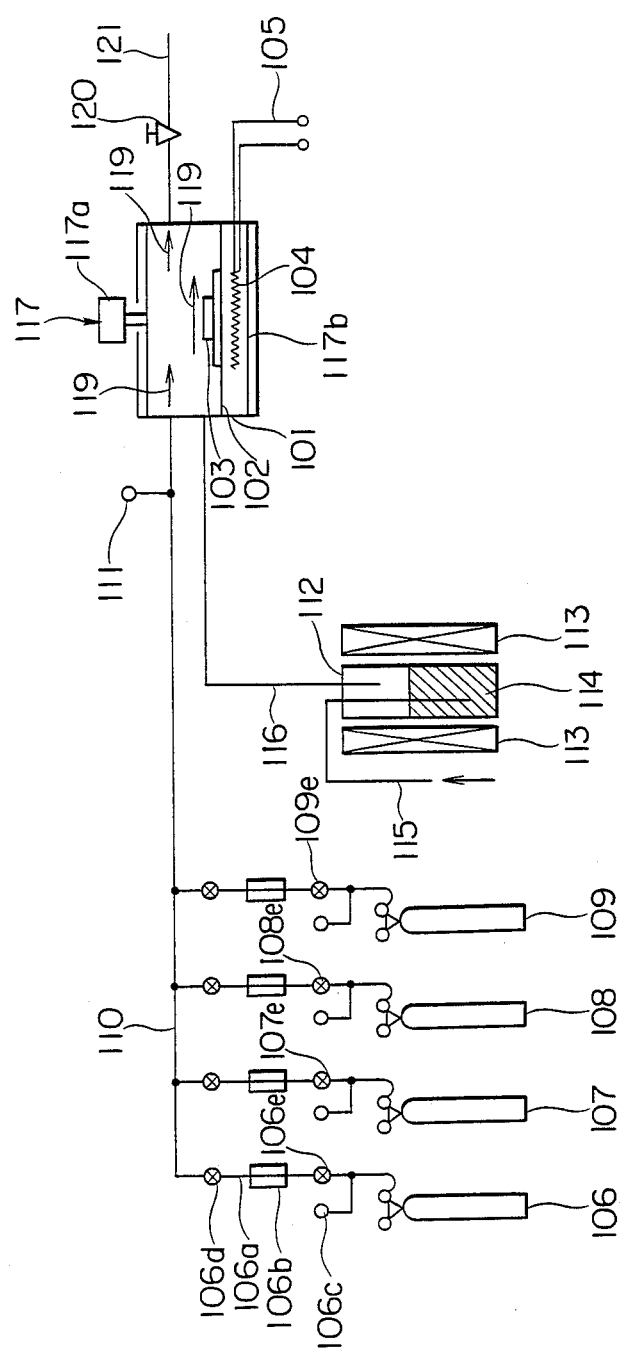

An apparatus shown in FIG. 7 was employed for preparing a-Si deposition films of i-, p- and n-type through the following operations.

Referring to FIG. 7, a film forming chamber 101 is provided therein with a substrate support 102 on which a desired substrate 103 is placed.

A heater 104 for heating the substrate is powered through lead wires 105, but is not activated during the film formation. The temperature of the substrate is not critical, but, in the case where the substrate is to be heated prior to the film formation in the execution of the method of the present invention, the substrate is heated to a temperature preferably in a range of 50°–150° C., more preferably 100°–150° C.

Gas sources 106–109 are provided for the silicon compound, and optionally for other gases such as hydrogen, halogen gas, inert gas, impurity-containing compound etc. A suitable gasifier is provided for any liquidous material to be employed. In said gas sources 106–109, suffixes a indicate branch tubes, b flow meters, c pressure gauges for measuring the pressure at the high-pressure side of the flow meters, d and e valves for adjusting flow rates. There are further provided a gas introducing tube 110 into the film forming chamber; a gas pressure gauge 111; an activating chamber 112; an electric furnace 113; solid carbon particles 114; an introducing tube 115 for the gaseous compound containing carbon and halogen for generating the active species; and an introducing tube 116 for the active species, generated in the activating chamber 112, into the film forming chamber 101.

A discharge energy generator 117 is provided for example with a matching box 117a and a high frequency cathode electrode 117b.

Discharge energy generated by the discharge energy generator 117 is applied to the raw material gases flowing in a direction 119, thus exciting said gases and causing reaction therein to form an a-Si deposition film on the substrate 103 or a part thereof. In FIG. 7 there are also shown an exhaust valve 120 and an exhaust tube 121.

At first a substrate 103 composed of a polyethylene terephthalate film was placed on the support 102, and the film forming chamber 101 was evacuated to $10^{-6}$ Torr with a vacuum system. The substrate was maintained at a temperature shown in Table 7, and 150 sccm of $Si_5H_{10}$ from the gas source 106, optionally mixed with 40 sccm of $PH_3$ or $B_2H_6$, diluted to 1000 ppm with hydrogen gas, was introduced into said chamber.

The activating chamber 102 was charged with solid carbon particles 114, which were fused by heating with the electric furnace 113, and $CF_4$ was blown therein from a bomb container through the tube 115, thus generating an acitve species $CF_2^*$ for supply into the film forming chamber 101 through the introducing tube 116.

Plasma was applied from the discharge energy generator while the film forming chamber was maintained at a pressure of 0.1 Torr, thus forming an undoped or doped a-Si film of a thickness of 700 Å, with a film forming rate of 20 Å/sec.

The undoped or p-type a-Si film thus formed was then placed in an evaporation tank for forming comb-shaped aluminum electrodes (length 250 μ, width 5 mm at a pressure of $10^{-5}$ torr. The obtained sample of a-Si film was evaluated by the dark conductivity $\sigma_d$ calculated from the dark current at an applied voltage of 10 V. The results are summarized in Table 7.

EXAMPLES 16–18

The process of Example 15 was reproduced except that $Si_5H_{10}$ was replaced by linear $Si_4H_{10}$, branched $Si_4H_{10}$ or $H_6Si_6F_6$. The obtained values of dark conductivity are summarized in Table 7.

The results in Table 7 indicate that the method of the present invention allows the obtainment of an a-Si film with a satisfactorily high value of $\sigma$ even at a low substrate temperature, and to achieve a sufficient doping therein.

EXAMPLE 19

Figure 8:
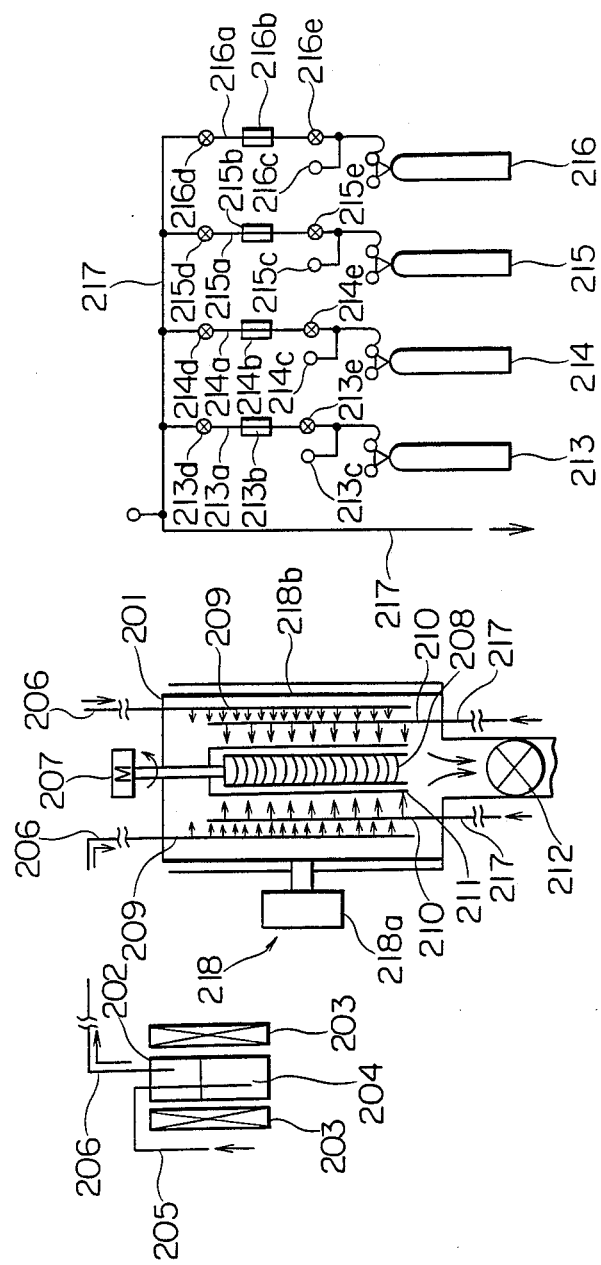

An apparatus shown in FIG. 8 was employed for preparing a drum-shaped electrophotographic imaging member of a structure as shown in FIG. 1, through the following operations.

Referring to FIG. 8, there are provided a film forming chamber 201, an activating chamber 202, an electric furnace 203, solid carbon particles 204, an active species introducing tube 206, a motor 207, a heater 208, blowing tubes 209 and 210, an aluminum cylinder 211, an exhaust valve 212, gas sources 213–216 similar to those 106–109 shown in FIG. 1, and a gas introducing tube 217.

The aluminum cylinder 211 suspended in the film forming chamber 201 was rendered rotatable by the motor 207 and was internally heated by the heater 208. Each discharge energy generator 218 is provided with a matching box 218a, a high frequency cathode 218b etc.

The activating chamber 202 was charged with solid carbon particles 204, which were melted by heating with the electric furnace 203, and $CF_4$ was blown therein from a bomb container to generate an active species $CF_2^*$ for supply into the film forming chamber 201 through the tube 206.

Separately $Si_2H_6$ and $H_2$ were introduced through the tube 217 into the chamber 201, and plasma from the discharge energy generator is applied to said chamber 201 maintained at a pressure of 1.0 Torr.

During the process, the aluminum cylinder 211 was heated to 280° C. by the heater and rotated, and the used gas was discharged through the exhaust valve 212. A photosensitive layer 13 was formed in this manner.

An intermediate layer of a thickness of 2000 Å was also formed by introducing a gaseous mixture of $H_2$ and $B_2H_6$, containing $B_2H_6$ in 0.2 vol. %, through the tube 217.

REFERENCE EXAMPLE 3

An amorphous silicon deposition film was formed in an ordinary plasma CVD process, utilizing $CF_4$, $Si_2H_6$, $H_2$ and $B_2H_6$ in the film forming chamber 201 shown in FIG. 8, additionally equipped with a high frequency generator of 13.56 MHz.

Table 8 summarizes the manufacturing conditions and performances of the drum-shaped electrophotographic imaging members obtained in Example 15 and Reference Example 3.

EXAMPLE 20

A PIN diode as shown in FIG. 2 was prepared in the apparatus shown in FIG. 7, utilizing $Si_3H_6$ as the silicon compound.

A polyethylene naphtalate film 21 having an evaporated IOT film 22 of a thickness of 1000 Å was placed on the support, and the chamber was evacuated to $10^{-6}$ Torr. Then an active species $CF_2^*$ was introduced from the tube 116 as in Example 15, also 150 sccm of $Si_3H_6$ and $PH_3$ diluted to 1000 ppm with hydrogen gas from the tube 110, and 20 sccm of a halogen gas from another tube. The chamber was maintained at a pressure of 0.1

Torr and plasma was applied by the discharge energy generator. In this manner there was obtained an n-type phosphorus-doped a-Si layer 24 of a thickness 700 Å.

Subsequently the foregoing step was repeated without the introduction of $PH_3$ to obtain an i-type a-Si layer 25 of a thickness of 5000 Å.

Then the foregoing step was repeated except that 40 sccm of diborane gas $B_2H_6$, diluted to 1000 ppm with hydrogen gas, was introduced, to obtain a boron-doped p-type a-Si layer 26 of a thickness of 700 Å. Then aluminum electrodes 27 of a thickness of 1000 Å were formed by vacuum evaporation on said p-type film to complete a PIN diode.

The diode element of an area of 1 cm² thus obtained was measured for I-V characteristic to evaluate the rectifying characteristic and photovoltaic effect. The obtained results are summarized in Table 9.

When illuminated with light of an intensity AMI (about 100 mW/cm²) through the substrate, the diode showed a conversion efficiency of 8.5% or higher, an open circuit voltage of 0.92 V, and a short circuit current of 10.5 mA/cm².

EXAMPLE 21

PIN diodes were prepared by repeating the process of Example 20 except that linear $Si_4H_{10}$, branched $Si_4H_{10}$ or $H_6Si_6H_6$ was employed as the silicon compound instead of $Si_3H_6$. The obtained rectifying characteristic and photovoltaic effect are summarized in Table 9.

The results in Table 9 indicate that the method of the present invention allows the obtainment of an a-Si deposition film of satisfactory optical and electrical characteristics at a lower substrate temperature than in the conventional technology.

The method for forming a deposition film of the present invention improves the electrical, optical, photoconductive and mechanical characteristics required in the formed film, and still enables high-speed film formation at a lower substrate temperature. The method also improves the reproducibility in the film formation, thus allowing the obtainment of a film of larger size having improved quality and uniformity. It is therefore possible to easily improve the productivity and to achieve the mass production of the film. Furthermore the method has the advantages of enabling film formation even on a substrate with a relatively poor thermal resistance, and achieving a shorter process through a low temperature process.

TABLE 1

| | Example 1 | Example 2 | Example 3 | Example 4 |
|---|---|---|---|---|
| Silicon compound | $Si_5H_{10}$ | $Si_4H_{10}$ | $SiH_3SiH-(SiH_3)SiH_3$ | $H_6Si_6F_6$ |
| Substrate temperature (°C.) | 50 | 60 | 80 | 75 |
| $\sigma_d$(undoped) $(\Omega \cdot cm)^{-1}$ | $7.9 \times 10^{-12}$ | $4.5 \times 10^{-12}$ | $5.3 \times 10^{-12}$ | $3 \times 10^{-12}$ |
| $\sigma_d$(p-type) $(\Omega \cdot cm)^{-1}$ | $7.1 \times 10^{-10}$ | $2.8 \times 10^{-10}$ | $4.1 \times 10^{-10}$ | $4 \times 10^{-10}$ |

TABLE 2

| | Example 5 | Reference Example 1 |
|---|---|---|
| Activating chamber | $CF_4$ | — |
| Activating temperature | 1100° C. | — |
| Active species generated | $CF_2*$ | — |
| Tube 217 | $Si_2H_6/H_2$ | — |
| Amount from activating chamber | 200 sccm | — |
| Amount from tube 217 | 100 sccm | — |
| Amounts from bombs | — | $CF_4$ 200 sccm $Si_2H_6$ 100 sccm $H_2$ 100 sccm |
| Pressure in film forming chamber | 1.0 Torr | 1.0 Torr |
| Substrate temperature Temperature in film forming chamber | | 260° C. |
| Film forming speed | 8 Å/sec | 5 Å/sec |
| Plasma RF | — | 130 W |
| Thickness of photosensitve layer 13 | 22μ | 17μ |
| Average number of defects in 10 electrophotographic imaging drums | 2 | 15 |
| Acceptance potential fluctuation in circumferential direction | ±10 V | ±30 V |
| Generatrix direction | ±15 V | ±35 V |
| Note | Method of present invention | Conventional plasma CVD process |

TABLE 3

| | Example 6 | Example 7 | Example 7 | Example 7 |
|---|---|---|---|---|
| Gaseous material for film formation | $Si_3H_6$ | $Si_4H_{10}$ | $SiH_3SiH-(SiH_3)SiH_3$ | $H_6Si_6F_6$ |
| Substrate temperature (°C.) | 80 | 80 | 80 | 80 |
| Rectification ratio of diode (*1) | $8 \times 10^2$ | $8 \times 10^2$ | $7 \times 10^2$ | $8.5 \times 10^2$ |
| n value of diode (*2) | 1.3 | 1.3 | 1.4 | 1.25 |

*1: Ratio of forward current to reverse current at a voltage of 1 V.
*2: Value n (quality factor) in pn junction $$\text{current equation } J = J_s \left\{ \exp\left(\frac{eV}{nRT}\right) - 1 \right\}$$

TABLE 4

| | Example 8 | Example 9 | Example 10 | Example 11 |
|---|---|---|---|---|
| Silicon compound | $Si_5H_{10}$ | $Si_4H_{10}$ | $SiH_3SiH-(SiH_3)SiH_3$ | $H_6Si_6F_6$ |
| Substrate temperature (°C.) | 280 | 280 | 280 | 280 |
| $\sigma_d$(undoped) $(\Omega \cdot cm)^{-1}$ | $7.6 \times 10^{-12}$ | $4.5 \times 10^{-12}$ | $5.3 \times 10^{-12}$ | $3.3 \times 10^{-12}$ |
| $\sigma_d$(p-type) $(\Omega \cdot cm)^{-1}$ | $7.1 \times 10^{-10}$ | $2.5 \times 10^{-10}$ | $4.1 \times 10^{-10}$ | $4.2 \times 10^{-10}$ |

TABLE 5

| | Example 12 | Reference Example 2 |
|---|---|---|
| Activating chamber | $CF_4$ | — |
| Activating temperature | 1100° C. | — |
| Active species generated | $CF_2*$ | — |
| Tube 217 | $Si_2H_6/H_2$ | — |
| Amount from activating chamber | 200 sccm | — |
| Amount from tube 217 | 100 sccm | — |
| Amounts from boms | — | $CF_4$ 200 sccm $Si_2H_6$ 100 sccm $H_2$ 100 sccm |
| Pressure in film | 1.0 Torr | 1.0 Torr |

TABLE 5-continued

|  | Example 12 | Reference Example 2 |
|---|---|---|
| forming chamber |  |  |
| Substrate temperature | 300° C. | 260° C. |
| Temperature in film forming chamber | 250° C. |  |
| Film forming speed | 15 Å/sec | 5 Å/sec |
| Plasma RF | — | 130 W |
| Thickness of photosensitive layer 13 | 22μ | 17μ |
| Average number of defects in 10 electrophotographic imaging drums | 2 | 15 |
| Acceptance potential fluctuation in circumferential direction | ±10 V | ±30 V |
| Generatrix direction | ±15 V | ±35 V |
| Note | Method of present invention | Conventional plasma CVD process |

TABLE 6

|  | Example 13 | Example 14 | Example 14 | Example 14 |
|---|---|---|---|---|
| Gaseous material for film formation | $Si_3H_6$ | $Si_4H_{10}$ | $SiH_3SiH-(SiH_3)SiH_3$ | $H_6Si_6F_6$ |
| Substrate temperature (°C.) | 280 | 280 | 280 | 280 |
| Rectification ratio of diode (*1) | $6 \times 10^2$ | $8 \times 10^2$ | $7.2 \times 10^2$ | $8.5 \times 10^2$ |
| n value of diode (*2) | 1.3 | 1.5 | 1.6 | 1.25 |

*1: Ratio of forward current to reverse current at a voltage of 1 V.
*2: Value n (quality factor) in pn junction $$\text{current equation } J = J_s \left( \exp\left(\frac{eV}{nRT}\right) - 1 \right).$$

TABLE 7

|  | Example 15 | Example 16 | Example 17 | Example 18 |
|---|---|---|---|---|
| Silicon compound | $Si_5H_{10}$ | $Si_4H_{10}$ | $SiH_3SiH-(SiH_3)SiH_3$ | $H_6Si_6F_6$ |
| Substrate temperature (°C.) | 280 | 280 | 280 | 280 |
| $\sigma_d$(undoped) $(\Omega \cdot cm)^{-1}$ | $6.8 \times 10^{-12}$ | $5.2 \times 10^{-12}$ | $5.3 \times 10^{-12}$ | $3.2 \times 10^{-12}$ |
| $\sigma_d$(p-type) $(\Omega \cdot cm)^{-1}$ | $7.1 \times 10^{-10}$ | $2.8 \times 10^{-10}$ | $4.3 \times 10^{-10}$ | $4 \times 10^{-10}$ |

TABLE 8

|  | Example 19 | Reference example 3 |
|---|---|---|
| Activating chamber | $CF_4$ | — |
| Activating temperature | 1100° C. | — |
| Active species generated | $CF_2^*$ | — |
| Tube 217 | $Si_2H_6/H_2$ | — |
| Amount from activating chamber | 200 sccm | — |
| Amount from tube 217 | 100 sccm | — |
| Amounts from bombs | — | $CF_4$ 200 sccm $Si_2H_6$ 100 sccm $H_2$ 100 sccm |
| Pressure in film forming chamber | 1.0 Torr | 1.0 Torr |
| Substrate temperature | 280° C. | 260° C. |
| Temperature in film forming chamber | 250° C. |  |
| Film forming speed | 18 Å/sec | 5 Å/sec |
| Plasma RF | 80 W | 130 W |
| Thickness of photosensitive layer 13 | 22μ | 17μ |
| Average number of defects in 10 electrophotographic imaging drums | 2 | 15 |
| Acceptance potential fluctuation in circumferential direction | ±10 V | ±30 V |
| generatrix direction | ±15 V | ±35 V |
| Note | Method of present invention | Conventional process |

TABLE 9

|  | Example 20 | Example 21 | Example 21 | Example 21 |
|---|---|---|---|---|
| Gaseous material for film formation | $Si_3H_6$ | $Si_4H_{10}$ | $SiH_3SiH-(SiH_3)SiH_3$ | $H_6Si_6F_6$ |
| Rectification ratio of diode (*1) | $8 \times 10^2$ | $7 \times 10^2$ | $5 \times 10^2$ | $7.5 \times 10^2$ |
| n value of diode (*2) | 1.5 | 1.3 | 1.4 | 1.25 |

*1: Ratio of forward current to reverse current at a voltage of 1 V.
*2: Value n (quality factor) in pn junction $$\text{current equation } J = J_s \left\{ \exp\left(\frac{eV}{nRT}\right) - 1 \right\}$$

What we claim is:

1. A method for forming a deposition film comprising introducing, into a film forming chamber for forming a deposition film on a substrate, a substrate, a gaseous or gasified silicon compound as a material for film formation and a gaseous or gasified active species containing carbon and halogen generated by decomposition of a compound containing carbon and halogen and capable of chemical interaction with said silicon compound, and applying to said silicon compound at least an energy selected from the group consisting of optical, thermal and discharge energies to excite said silicon compound and cause a reaction thereof, thus forming a deposition film on said substrate; said compound containing carbon and halogen being selected from the group consisting of linear carbon halides having the formula $C_uY_{2u+2}$, cyclic carbon halides having the formula $C_uY_{2v}$, and linear or cyclic compounds having the formula $C_uH_xY_y$, wherein u is an integer greater than or equal to 1, Y is F, Cl, Br or I, v is an integer greater than or equal to 3, and x+y is equal to 2u or 2u+2.

2. A method according to claim 1, wherein said silicon compound is a linear silane compound.

3. A method according to claim 1, wherein said silicon compound is a cyclic silane compound.

4. A method according to claim 1, wherein said compound containing carbon and halogen is a linear carbon halide.

5. A method according to claim 1, wherein said compound containing carbon and halogen is a cyclic carbon halide.

6. A method according to claim 1, further comprising the use of an active species generated from a compound containing silicon and halogen.

7. A method according to claim 1, wherein the generation of said active species is conducted by means of at least an exciting energy selected from the group consisting of discharge, thermal and optical energies.

8. A method according to claim 1, wherein the ratio of said silicon compound and said active species introduced into said chamber is in a range from 10:1 to 1:10 in the introduced flow rates.

9. A method according to claim 1, which further comprises introducing a compound containing an impurity element.

10. A method according to claim 9, wherein the impurity element belongs to the group IIIA of the periodic table.

11. A method according to claim 9, wherein the impurity element belongs to the group VA of the periodic table.

* * * * *

UNITED STATES PATENT AND TRADEMARK OFFICE
CERTIFICATE OF CORRECTION

PATENT NO. : 4,759,947

DATED : July 26, 1988

INVENTOR(S) : SHUNICHI ISHIHARA, ET AL.

It is certified that error appears in the above-identified patent and that said Letters Patent is hereby corrected as shown below:

AT [56] IN REFERENCES CITED

U.S. Patent Documents,
"4,546,008   10/1985   Smith et al. ..... 427/86"
should read
--4,546,008   10/1985   Saitoh et al. ..... 427/86--.

COLUMN 4

Line 19, "y" should read --Y--.
Line 34, "$Si_x Z_{2v+2}$" should read --$Si_y Z_{2v+2}$--.

COLUMN 6

Line 1, "electro" should read --electron--.

COLUMN 7

Line 18, "ITO In-" should read --ITO (In- --.
Line 19, "$_2O_3 + SnO_2$ etc." should read
          --$_2O_3 + SnO_2$) etc.--.
Line 21, "electrodes 32, 27" should read
          --electrodes 22, 27--.

COLUMN 8

Line 41, "15 $\overset{\circ}{A}A$/sec." should read --15 $\overset{\circ}{A}$/sec.--.

UNITED STATES PATENT AND TRADEMARK OFFICE
CERTIFICATE OF CORRECTION

PATENT NO. : 4,759,947

DATED : July 26, 1988

INVENTOR(S) : SHUNICHI ISHIHARA, ET AL.

It is certified that error appears in the above-identified patent and that said Letters Patent is hereby corrected as shown below:

COLUMN 14

Line 62, "IOT" should read --ITO--.

Signed and Sealed this

Second Day of May, 1989

Attest:

DONALD J. QUIGG

Attesting Officer

Commissioner of Patents and Trademarks